United States Patent
Wang et al.

(10) Patent No.: US 9,647,110 B2
(45) Date of Patent: May 9, 2017

(54) LAYOUT FOR LDMOS

(71) Applicant: SEMICONDUCTOR MANUFACTURING INTERNATIONAL (SHANGHAI) CORPORATION, Shanghai (CN)

(72) Inventors: Haiqiang Wang, Shanghai (CN); Yong Cheng, Shanghai (CN); Xianyong Pu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/921,999

(22) Filed: Oct. 23, 2015

(65) Prior Publication Data

US 2016/0204250 A1    Jul. 14, 2016

(51) Int. Cl.
*H01L 21/70* (2006.01)
*H01L 29/78* (2006.01)
*H01L 29/06* (2006.01)
*H01L 29/10* (2006.01)
*H01L 29/417* (2006.01)
*H01L 29/08* (2006.01)
*H01L 29/423* (2006.01)

(52) U.S. Cl.
CPC ...... *H01L 29/7823* (2013.01); *H01L 29/0696* (2013.01); *H01L 29/1095* (2013.01); *H01L 29/41758* (2013.01); *H01L 29/423* (2013.01); *H01L 29/0869* (2013.01); *H01L 29/0886* (2013.01); *H01L 29/4238* (2013.01); *H01L 29/7816* (2013.01)

(58) Field of Classification Search
CPC .................. H01L 29/0696; H01L 29/404
USPC ................................... 257/390, 77
See application file for complete search history.

(56) References Cited

U.S. PATENT DOCUMENTS

| | | | |
|---|---|---|---|
| 2013/0193509 A1* | 8/2013 | Luo ............. | H01L 27/1203 257/330 |
| 2015/0137260 A1* | 5/2015 | Matsui ......... | H01L 23/528 257/390 |
| 2015/0162439 A1* | 6/2015 | Hoentschel .... | H01L 29/7816 257/77 |

* cited by examiner

*Primary Examiner* — Julio J Maldonado
*Assistant Examiner* — Hajar Kolahdouzan
(74) *Attorney, Agent, or Firm* — Kilpatrick Townsend & Stockton LLP

(57) ABSTRACT

A layout structure, a semiconductor device and an electronic apparatus are provided. The layout structure includes at least one LDMOS. The LDMOS includes a source, a drain and a gate. The drain is strip-shaped, the source and gate are cyclic structures, the inner circumference of the source is less than the outer circumference of the gate but is greater than the inner circumference of the gate, the inner ring of the source overlaps with the gate in all directions, and the drain is located inside the inner ring of the gate. Because the source and gate are configured as cyclic structures and the inner ring of the source overlaps with the gate in every direction, the layout structure can increase the current and reduce the area of LDMOS devices. Semiconductor devices manufactured based on the layout structure and electronic apparatuses including the semiconductor devices also have the above-described advantages.

16 Claims, 4 Drawing Sheets

LAYOUT FOR LDMOS

CROSS-REFERENCES TO RELATED APPLICATIONS

This application claims priority to Chinese patent application No. 201410554711.3, filed on Oct. 17, 2014, the content of which is incorporated herein by reference in its entirety.

BACKGROUND OF THE INVENTION

The present invention relates to semiconductor technologies, and more particularly to a layout structure, a semiconductor device and an electronic apparatus.

In semiconductor technology field, laterally diffused metal oxide semiconductor (LDMOS) has apparent advantages over transistors in key device characteristics (such as gain, linearity, switching performance, thermal dissipation performance and stage number reduction, etc.), and can be easily made compatible with complementary metal oxide semiconductor (CMOS) technology, and thus is widely used in fields such as radio frequency circuits.

In current technology, a conventional LDMOS layout shown in FIG. 1A includes a source 101, a drain 102 and a gate 103. Among them, source 101, drain 102 and gate 103 are all strip-shaped structures. The overlapping area of gate 103 and source 101 defines the channel width of the device, and thus determines the current density per unit area of the device. In an existing LDMOS layout, source 101 and gate 103 are strip-shaped, which limits the overlapping area between them, and therefore, in certain practical applications, it is difficult for such LDMOS layout to meet the requirements of large current density per unit area and small LDMOS area (i.e., size of the device).

In addition, in a layout design of a semiconductor device including at least two adjacent LDMOS devices, if the LDMOS layout uses a structure shown in FIG. 1A, the layout structure of the semiconductor device is generally as shown in FIG. 1B, which includes source 101, drain 102, gate 103, a body electrode 104, and contact holes (CTs) 105, wherein source 101, drain 102 and gate 103 are all strip-shaped, and adjacent LDMOS devices share a drain. In such layout structure, because source 101, drain 102 and gate 103 are all strip-shaped, in order to achieve body pickup, two to three rows of contact holes 105 are typically disposed in a neighboring region between two adjacent LDMOS devices. FIG. 1B illustrates an embodiment where three rows of contact holes 105 are disposed in a neighboring region between two adjacent LDMOS devices, wherein a row of contact holes is disposed on the source of each of the two LDMOS devices and a row of contact holes is disposed on the body electrode at a neighboring location of the adjacent LDMOS devices. It can be seen that, because such layout structure provides 2 to 3 rows of contact holes in the neighboring region between two adjacent LDMOS devices, a significant layout area may be wasted, which goes against reducing layout area.

Thus, existing LDMOS layout has difficulties in increasing the current density per unit area and reducing the area of the LDMOS, and a semiconductor device layout structure including a plurality of LDMOS layouts would occupy a large layout area due to the presence of 2 to 3 rows of LDMOS contact holes at a neighboring region between adjacent LDMOS devices. Therefore, in order to solve the above technical problems, it is desirable to provide a new layout structure.

BRIEF SUMMARY OF THE INVENTION

To cure the deficiencies of current technology, embodiments of the present invention provide a layout structure, a semiconductor device, and an electronic apparatus that can increase the current and reduce the area of LDMOS devices.

An embodiment of the present invention provides a layout structure. The layout structure includes at least one LDMOS, which includes a source, a drain and a gate, wherein the drain is a strip-shaped structure, the source and the gate are cyclic or ring structures, the inner circumference of the source is less than the outer circumference of the gate but is greater than the inner circumference of the gate, the inner ring of the source overlaps with the gate in all directions, and the drain is located inside the inner ring of the gate. It is noted that the term "cyclic structure" and "ring structure" are used interchangeably.

Optionally, the cyclic structure of the source includes a cyclic structure formed by a circle, an ellipse, a square, or a rectangle with a portion, e. g., a circle, removed from the central region of the circle, the ellipse or the rectangle, or a cyclic structure formed by a rectangle with an ellipse removed from the central region of the rectangle.

Optionally, the cyclic structure of the gate includes a cyclic structure formed by a circle, an ellipse or a rectangle with a circle removed from the central region of the circle, the ellipse or the rectangle, or a cyclic structure formed by a rectangle with an ellipse removed from the central region of the rectangle.

Optionally, the strip-shaped structure of the drain includes a straight rectangle or a rounded rectangle.

Optionally, the layout structure includes at least two LDMOS devices, a body electrode at the peripheral of the at least two LDMOS devices, and contact holes disposed on the source, the drain, the gate and the body electrode, wherein only one row of contact holes is disposed in the neighboring region of adjacent LDMOS devices.

Optionally, the body electrode is a cyclic structure.

Optionally, the layout structure further includes a lumped body electrode disposed in the neighboring region of adjacent LDMOS devices, wherein at least one contact hole is disposed on the lumped body electrode.

In another embodiment of the present invention, there is provided a semiconductor device, which comprises at least one LDMOS including a source, a drain and a gate, wherein the drain is a strip-shaped structure in a plan view, the source and the gate are cyclic structures in the plan view, the inner circumference of the plan view of the source is less than the outer circumference of the plan view of the gate but is greater than the inner circumference of the plan view of the gate, the inner ring of the plan view of the source overlaps with the plan view of the gate in all directions in a horizontal plane, and the drain is located inside the inner ring of the gate in the plan view.

Optionally, the cyclic structure of the plan view of the source includes a cyclic structure formed by a circle, an ellipse or a rectangle with a circle removed from the central region of the circle, the ellipse or the rectangle, or a cyclic structure formed by a rectangle with an ellipse removed from the central region of the rectangle.

Optionally, the cyclic structure of the plan view of the gate includes a cyclic structure formed by a circle, an ellipse or a rectangle with a circle removed from the central region of the circle, the ellipse or the rectangle, or a cyclic structure formed by a rectangle with an ellipse removed from the central region of the rectangle.

Optionally, the strip-shaped structure of the plan view of the drain includes a straight rectangle or a rounded rectangle.

Optionally, the semiconductor device includes at least two LDMOS devices, a body electrode located at the peripheral of the at least two LDMOS devices, and contact holes disposed on the source, the drain, the gate and the body electrode, wherein only one row of contact holes is disposed in the neighboring region of adjacent LDMOS devices.

Optionally, the plan view of the body electrode is a cyclic structure.

Optionally, the semiconductor device further includes a lumped body electrode disposed in the neighboring region of adjacent LDMOS devices, wherein at least one contact hole is disposed on the lumped body electrode.

In another embodiment of the present invention, an electronic apparatus is provided. The electronic apparatus includes a semiconductor device and electronic components coupled to the semiconductor device. The semiconductor device includes at least one LDMOS device including a source, a drain and a gate, wherein the drain is a strip-shaped structure in a plan view, the source and the gate are cyclic structures in the plan view, the inner circumference of the plan view of the source is less than the outer circumference of the plan view of the gate but is greater than the inner circumference of the plan view of the gate, the inner ring of the plan view of the source overlaps with the plan view of the gate in all directions in a horizontal plane, and the drain is located inside the inner ring of the gate in the plan view.

Optionally, the semiconductor device includes at least two LDMOS devices, a body electrode located at the peripheral of the at least two LDMOS devices, and contact holes disposed on the source, the drain, the gate and the body electrode, wherein only one row of contact holes is disposed in a neighboring region of adjacent LDMOS devices.

In the layout structure of the present invention, because the source and gate are configured as cyclic structures and the inner ring of the source overlaps with the gate in every direction, the layout structure can increase the current and reduce the area of the LDMOS device. The semiconductor device of the present invention is manufactured based on the layout structure described above, and thus also has the aforementioned advantages. The electronic apparatus of the present invention includes the semiconductor device described above, and thus also has the above-described advantages.

BRIEF DESCRIPTION OF THE DRAWINGS

The following drawings, as a part of the present disclosure, will provide a better understanding of the present invention. The drawings illustrate embodiments of the present invention, and together with the accompanying description, serve to explain the principles of the present invention. Among the drawings.

DETAILED DESCRIPTION OF THE INVENTION

Figure 1A:
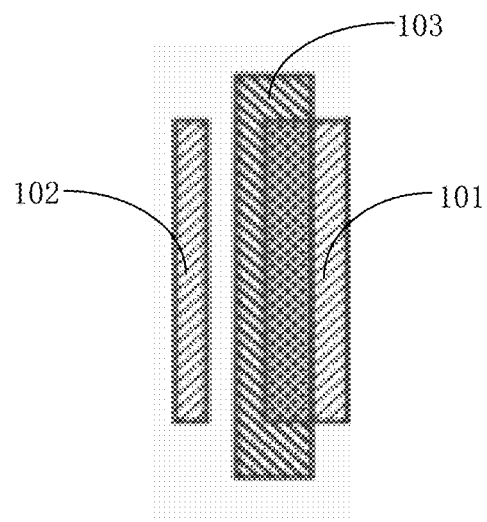
FIG. 1A is a schematic diagram illustrating an existing LDMOS layout structure.
Figure 1B:
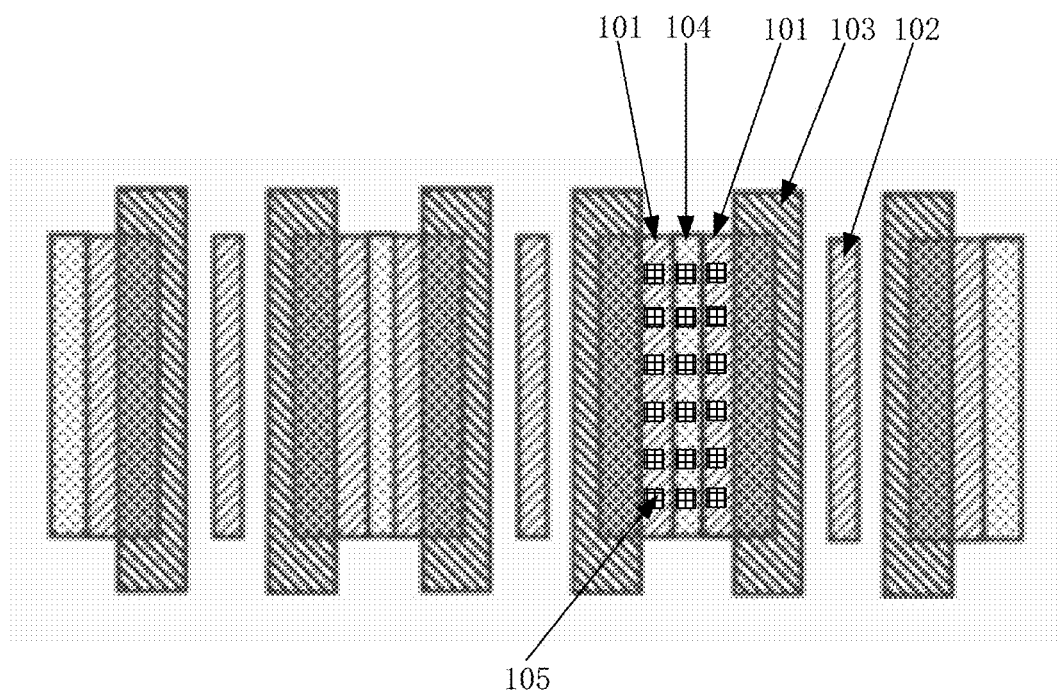
FIG. 1B is a schematic diagram illustrating an existing layout structure of a semiconductor device with at least two LDMOS devices.

In the following description, numerous specific details are provided for a thorough understanding of the present invention. However, it should be apparent to those of skill in the art that the present invention may be realized without one or more of these details. In other examples, technical features known in the art will not be described in order not to obscure the present invention.

It should be understood that the present invention may be realized in different forms, and should not be construed as limited to the embodiments provided in the present disclosure. Rather, these embodiments are provided to make the present disclosure more thorough and complete, and to fully convey to those of skill in the art the scope of the present invention. In the accompanying drawings, the dimensions and relative dimensions of various layers and regions may be exaggerated for clarity. Same reference numbers are used to represent same elements throughout the drawings.

It should be understood that, when an element or layer is referred to as "on," "adjacent to," "connected to" or "coupled to" another element or layer, it can be disposed directly on the other element or layer, adjacent to, connected or coupled to the other element or layer, or intervening elements or layers which may also be present. In contrast, when an element is referred to as being "directly on," "directly adjacent to," "directly connected to" or "directly coupled to" another element or layer, there are no intervening elements or layers present between them. It should be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the teachings of the present invention.

Spatial relationship terms, such as "under," "below," "bottom," "underneath," "over," "on," "above" and "top," are used herein for convenience, to describe a relationship of one element or feature with another element or feature as illustrated in the figures. It should be understood that, in addition to the orientation depicted in the figures, these spatial relationship terms are intended to encompass different orientations of devices in use and during operation. For example, if a device shown in the figures is flipped, an element being described as "below" or "underneath" another element would then be oriented as "above" the other element. Therefore, the exemplary term "below," "under" or "underneath" can encompass both orientations of above and below. Because devices or components of embodiments of the present invention can be positioned in a number of different orientations (e.g., rotated 90 degrees or at other orientations), the spatial relationship terms used herein should be interpreted accordingly.

The terms used herein are for the purpose of describing the embodiments and are not intended to limit the present invention. As used herein, the singular terms "a," "an" and "the" may include singular and plural references, unless clearly indicated otherwise in the context. It should be further understood that the terms "comprising," "including," "having" and variants thereof, when used in this specification, specify the presence of stated features, numbers, steps, operations, elements and/or components, but do not preclude the presence or addition of one or more other features, numbers, steps, operations, elements, components and/or groups thereof. Furthermore, as used herein, the words "and/or" may refer to and encompass any and all possible combinations of one or more of the corresponding listed items.

Embodiments of the present invention are described herein with reference to cross-sectional schematic diagram of ideal embodiments (and intermediate structures) of the present invention. Thus, it is expected that the shapes shown in the figures may vary due to, for example, manufacturing techniques and/or tolerances. Thus, embodiments of the present invention should not be limited to the particular shapes of regions illustrated herein, but are to include variations in shapes caused by, for example, fabrication. For example, an implant region shown as a rectangle may generally have rounded or curved edge characteristics and/or a gradient of implant concentration, rather than a binary change from an implant region to a non-implant region. Similarly, a buried region formed by implantation may result in implantations in regions between the buried region and the surfaces through which ions pass during the implantation. Therefore, the regions shown in the figures are for illustration purpose only, and their shapes are not intended to show the actual shape of areas of the device, and are not intended to limit the scope of the present invention.

In the following description, numerous detailed processes are provided to describe the technical solution provided in the present invention, for a thorough understanding of the present invention. Preferred embodiments of the present invention are described below in detail, however, the present invention may be realized in numerous other embodiments, in addition to the embodiments described in detail herein.

Example I

Embodiments of the present invention provides an LDMOS layout structure, and, based on this, a layout structure including at least two LDMOS devices. The LDMOS layout structure can increase the current density per unit area of the LDMOS (thereby increasing the LDMOS current), and can reduce the area of the LDMOS. The layout structure including at least two LDMOS devices can reduce the number of rows of contact holes in a neighboring region of LDMOS devices, thereby reducing the area of the layout.

Figure 2:
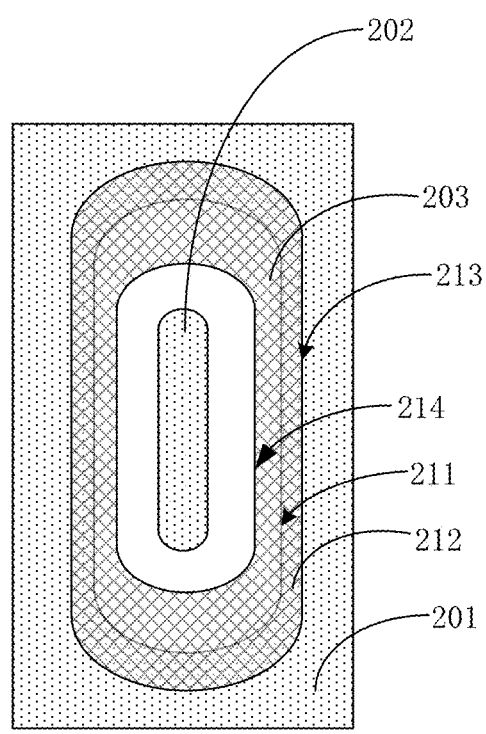
FIG. 2 illustrates a schematic diagram of a layout structure of an LDMOS, according to an embodiment of the present invention.

FIG. 2 is referred to next to describe LDMOS layout structures according to embodiments of the present invention.

As shown in FIG. 2, an LDMOS layout structure according to an embodiment of the present invention includes a source 201, a drain 202 and a gate 203, wherein, source 201 is a cyclic or ring structure, drain 202 is a strip-shaped structure, and gate 203 is also a cyclic or ring structure. In FIG. 2, the inner circumference 211 of source 201 is less than the outer circumference 213 of gate 203 but is greater than the inner circumference 214 of gate 203, the inner ring 212 of source 201 overlaps with gate 203 in all directions, and drain 202 is located inside the inner ring of gate 203.

In the present embodiment, the cyclic structure of source 201 may be a ring, an elliptical ring, a cyclic structure formed by a rectangle with a circle removed from its central area, or a cyclic structure formed by a rectangle with an ellipse removed from its central area, and may not be limited to these structures. The strip-shaped structure of drain 202 may be a straight rectangle, a rounded rectangle, a square, or other suitable shapes. The cyclic structure of gate 203 may be an elliptical ring, a cyclic structure formed by a rectangle with a circle removed from its central area, or a cyclic structure formed by a rectangle with an ellipse removed from its central area, and may not be limited to these structures either.

In the embodiment, the relative vertical layer position of source 201, drain 202 and gate 203 can be designed according to various existing layout designs, and is not limited in the present embodiment.

In LDMOS layouts according to embodiments of the present invention, because source 201 and gate 203 are configured as cyclic structures, and the inner ring of source 201 overlaps with gate 203 in all directions, the total channel width can be increased such that the LDMOS can have a higher current density per unit area. Thus, even with a reduced LDMOS layout area, a desired current density per unit area can still be achieved. In other words, the LDMOS layout area can be reduced to certain extent.

Figure 3:
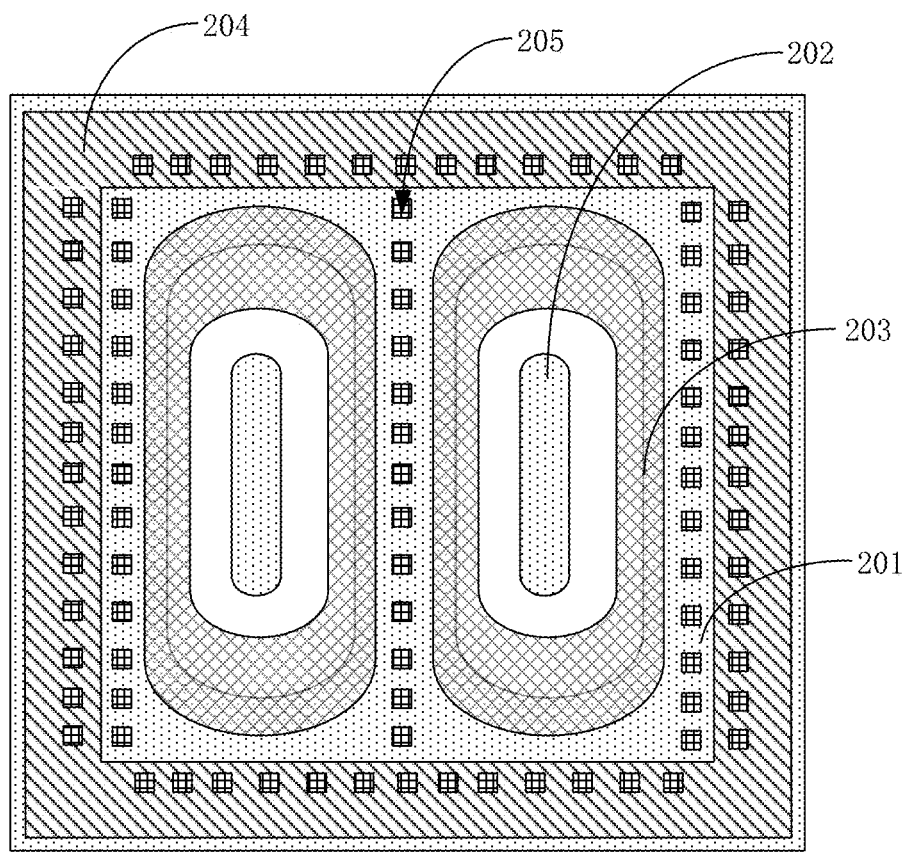
FIG. 3 illustrates a schematic diagram of a layout structure of a semiconductor device including at least two LDMOS devices, according to an embodiment of the present invention.
Figure 4:
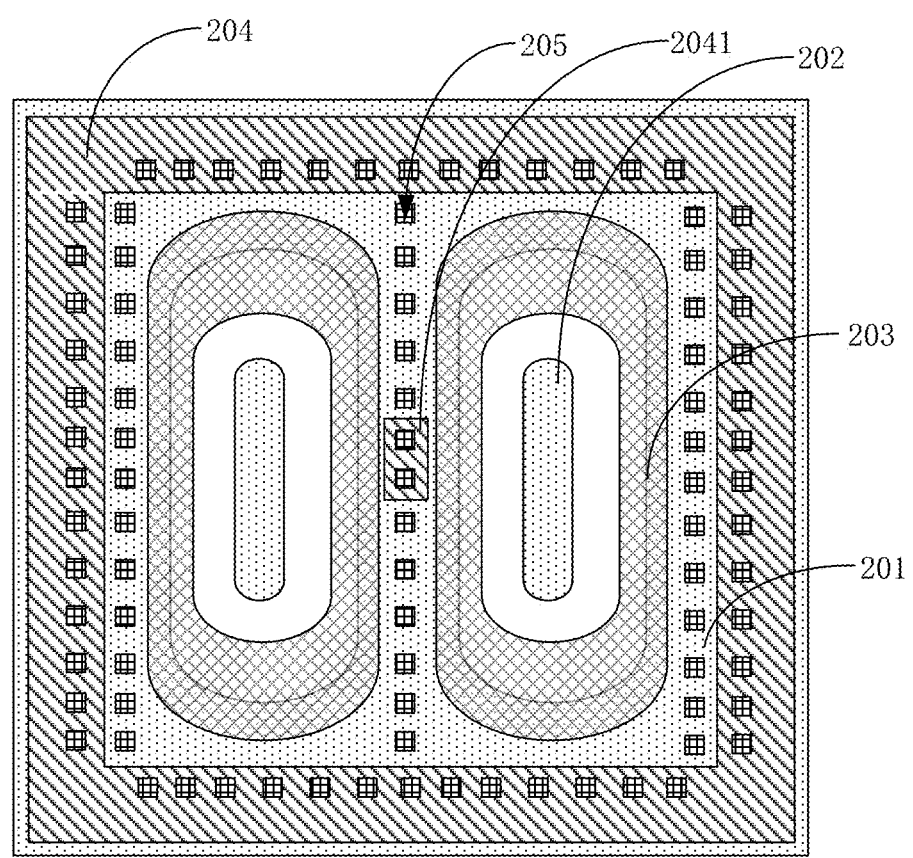
FIG. 4 illustrates another schematic diagram of a layout structure of a semiconductor device including at least two LDMOS devices, according to an embodiment of the present invention.

FIGS. 3 and 4 are referred to next to describe LDMOS layout structures including at least two LDMOS devices according to embodiments of the present invention.

The layout structure shown in FIG. 3 or 4 includes at least two LDMOS devices, wherein each LDMOS device employs the above layout structure. For example, FIG. 3 shows two adjacent LDMOS devices. In addition to the two LDMOS devices, the layout structure also includes a body electrode 204 located at the peripheral of the two LDMOS devices, and contact holes 205 for connecting source 201, drain 202, gate 203 and body electrode 204. Body electrode 204 may be cyclic or other suitable shapes. One difference between the layout structure of this embodiment and existing technology is that only one row of contact holes 205 is disposed in the neighboring region of two adjacent LDMOS devices as shown in FIG. 3, while 2 to 3 rows of contact holes are disposed in existing technology. Because the layout structure has only one row of contact holes 205 disposed in the neighboring region of two adjacent LDMOS devices, it can greatly reduce the area of the layout.

FIG. 4 illustrates another schematic diagram of a layout structure including at least two LDMOS devices according to embodiments of the present invention. The layout structure shown in FIG. 4 is substantially the same as the layout structure shown in FIG. 3, and the difference is that, in the structure shown in FIG. 4, a lumped body electrode 2041 is provided in the neighboring region between two adjacent LDMOS devices, wherein at least one contact hole 205 is disposed on lumped electrode 2041. Lumped body electrode 2041 can be formed by ion implantation in the semiconductor manufacturing process. Due to the addition of lumped body electrode 2041, the layout structure shown in FIG. 4 can further improve the body pickup, and thus can improve the performance of semiconductor devices manufactured based on the layout, and suppress the activation of transistors.

Example II

Embodiments of the present invention provide a semiconductor device manufactured based on the embodiments of layout structure described in Example I.

By way of example, a semiconductor device according to embodiments of the present invention includes at least one LDMOS, the LDMOS comprising a source, a drain and a gate, wherein the drain is a strip-shaped structure in a plan view, the source and the gate are cyclic structures in the plan view, the inner circumference of the plan view of the source is less than the outer circumference of the plan view of the gate but is greater than the inner circumference of the plan view of the gate, the inner ring of the plan view of the source overlaps with the plan view of the gate in all directions in a horizontal plane, and the drain is located inside the inner ring of the gate in the plan view.

In the semiconductor device, the cyclic structure of the plan view of the source includes a cyclic structure formed by a circle, an ellipse or a rectangle with a circle removed from the central region of the circle, the ellipse or the rectangle, a cyclic structure formed by a rectangle with an ellipse removed from the central region of the rectangle, or other suitable structures.

The cyclic structure of the plan view of the gate includes a cyclic structure formed by a circle, an ellipse or a rectangle with a circle removed from the central region of the circle, the ellipse or the rectangle, a cyclic structure formed by a rectangle with an ellipse removed from the central region of the rectangle, or other suitable structures.

The strip-shaped structure of the plan view of the drain includes a straight rectangle, a rounded rectangle, or other suitable structures.

In one example, the semiconductor device includes at least two LDMOS devices, a body electrode located at the peripheral of the at least two LDMOS devices, and contact holes disposed on the source, the drain, the gate and the body electrode, wherein only one row of contact holes is disposed in a neighboring region of adjacent LDMOS devices.

In the example, the plan view of the body electrode is a cyclic structure or other suitable structures.

In the example, the semiconductor device further includes a lumped body electrode disposed in the neighboring region of adjacent LDMOS devices, wherein at least one contact hole is disposed on the lumped body electrode.

Other specific structures of semiconductor devices according to embodiments of the present invention can be obtained with reference to the layout structure described above in Example I, and are not repeated here.

Compared with existing technology, semiconductor devices according to embodiments of the present invention can increase the LDMOS current, and reduce the size of LDMOS devices, thereby reducing the size of the semiconductor devices.

Example III

Embodiments of the present invention provide an electronic apparatus including a semiconductor device and electronic components coupled to the semiconductor device. Among them, the semiconductor device is a semiconductor device manufactured based on the layout structure of Example I, namely, a semiconductor device as described in Example II. The electronic components can be any electronic components, such as discrete devices or integrated circuits.

By way of example, the semiconductor device includes at least one LDMOS device including a source, a drain and a gate, wherein the drain is a strip-shaped structure in a plan view, the source and the gate are cyclic structures in the plan view, the inner circumference of the plan view of the source is less than the outer circumference of the plan view of the gate but is greater than the inner circumference of the plan view of the gate, the inner ring of the plan view of the source overlaps with the plan view of the gate in all directions in a horizontal plane, and the drain is located inside the inner ring of the gate in the plan view.

Furthermore, the semiconductor device may include at least two LDMOS devices, a body electrode located at the peripheral of the at least two LDMOS devices, and contact holes disposed on the source, the drain, the gate and the body electrode, wherein only one row of contact holes is disposed in a neighboring region of adjacent LDMOS devices.

Embodiments of the electronic apparatus in Example III include a cellular phone, a tablet, a laptop, a netbook, a game console, a television, a video compact disk (VCD) system, a digital video disk (DVD) system, a navigation system, a camera, a video camera, a voice recorder, an MP3 device, an MP4 device, a PlayStation Portable (PSP) or any other electronic product or equipment. The electronic apparatus may also include any intermediate product including the semiconductor device described above.

Because the electronic apparatus according to embodiments of the present invention uses the above-described semiconductor device, the electronic apparatus also has the advantages described above.

While the present invention is described herein with reference to illustrative embodiments, it should be understood that the above illustrative embodiments are for exemplification and illustration purpose only, and are not intended to limit the present invention to the embodiments described herein. Those of skill in the art would appreciate that the present invention is not limited to the above embodiments, and various different forms and modifications of the described embodiments may be made according to the teachings of the present invention, which all fall within the scope of protection of the present invention. The scope of protection of the present invention is determined by the attached claims and their equivalent thereof.

What is claimed is:

1. A layout structure, comprising at least one laterally diffused metal oxide semiconductor (LDMOS), the at least one LDMOS including a source, a drain and a gate, wherein the drain is a strip-shaped structure, the source and the gate are cyclic structures, an inner circumference of the source is less than an outer circumference of the gate but is greater than an inner circumference of the gate, an inner ring of the source overlaps with the gate in all directions, and the drain is located inside the inner circumference of the gate and does not overlap an area defined by the inner circumference of the gate.

2. The layout structure of claim 1, wherein the cyclic structure of the source includes a cyclic structure formed by a circle, an ellipse or a rectangle with a circle removed from a central region of the circle, the ellipse or the rectangle, or a cyclic structure formed by a rectangle with an ellipse removed from a central region of the rectangle.

3. The layout structure of claim 1, wherein the cyclic structure of the gate includes a cyclic structure formed by a circle, an ellipse or a rectangle with a circle removed from a central region of the circle, the ellipse or the rectangle, or a cyclic structure formed by a rectangle with an ellipse removed from a central region of the rectangle.

4. The layout structure of claim 1, wherein the strip-shaped structure of the drain includes a straight rectangle or a rounded rectangle.

5. The layout structure of claim 1, wherein the layout structure includes at least two LDMOS devices, a body electrode located at the peripheral of the at least two LDMOS devices, and contact holes disposed on the source, the drain, the gate and the body electrode; and wherein only one row of contact holes is disposed in a neighboring region of adjacent LDMOS devices.

6. The layout structure of claim 5, wherein the body electrode is a cyclic structure.

7. The layout structure of claim 5, wherein the layout structure further includes a lumped body electrode disposed in the neighboring region of the adjacent LDMOS devices; and wherein at least one contact hole is disposed on the lumped body electrode.

8. A semiconductor device, comprising at least one laterally diffused metal oxide semiconductor (LDMOS), the at least one LDMOS including a source, a drain and a gate, wherein the drain is a strip-shaped structure in a plan view, the source and the gate are cyclic structures in the plan view, an inner circumference of the plan view of the source is less than an outer circumference of the plan view of the gate but is greater than an inner circumference of the plan view of the gate, an inner ring of the plan view of the source overlaps with the plan view of the gate in all directions in a horizontal plane, and the drain is located inside the inner circumference of the gate in the plan view and does not overlap an area defined by the inner circumference of the gate.

9. The semiconductor device of claim 8, wherein the cyclic structure of the plan view of the source includes a cyclic structure formed by a circle, an ellipse or a rectangle with a circle removed from a central region of the circle, the ellipse or the rectangle, or a cyclic structure formed by a rectangle with an ellipse removed from a central region of the rectangle.

10. The semiconductor device of claim 8, wherein the cyclic structure of the plan view of the gate includes a cyclic structure formed by a circle, an ellipse or a rectangle with a circle removed from a central region of the circle, the ellipse or the rectangle, or a cyclic structure formed by a rectangle with an ellipse removed from a central region of the rectangle.

11. The semiconductor device of claim 8, wherein the strip-shaped structure of the plan view of the drain includes a straight rectangle or a rounded rectangle.

12. The semiconductor device of claim 8, wherein the semiconductor device includes at least two LDMOS devices, a body electrode located at a peripheral of the at least two LDMOS devices, and contact holes disposed on the source, the drain, the gate and the body electrode; and wherein only one row of contact holes is disposed in a neighboring region of adjacent LDMOS devices.

13. The semiconductor device of claim 12, wherein the plan view of the body electrode is a cyclic structure.

14. The semiconductor device of claim 12, wherein the semiconductor device further includes a lumped body electrode disposed in the neighboring region of the adjacent LDMOS devices; and wherein at least one contact hole is disposed on the lumped body electrode.

15. An electronic apparatus, comprising:
a semiconductor device; and
electronic components coupled to the semiconductor device;
wherein the semiconductor device includes at least one LDMOS, the at least one LDMOS including a source, a drain and a gate, wherein the drain is a strip-shaped structure in a plan view, the source and the gate are cyclic structures in the plan view, an inner circumference of the plan view of the source is less than an outer circumference of the plan view of the gate but is greater than an inner circumference of the plan view of the gate, an inner ring of the plan view of the source overlaps with the plan view of the gate in all directions in a horizontal plane, and the drain is located inside the inner circumference of the gate in the plan view and does not overlap an area defined by the inner circumference of the gate.

16. The electronic apparatus of claim 15, wherein the semiconductor device includes at least two LDMOS devices, a body electrode located at a peripheral of the at least two LDMOS devices, and contact holes disposed on the source, the drain, the gate and the body electrode; and wherein only one row of contact holes is disposed in a neighboring region of adjacent LDMOS devices.

* * * * *